(12) United States Patent
Chang et al.

(10) Patent No.: US 10,566,487 B2
(45) Date of Patent: Feb. 18, 2020

(54) SOLAR CELL AND METHOD OF MANUFACTURING THE SAME

(71) Applicant: LG ELECTRONICS INC., Seoul (KR)

(72) Inventors: Wonjae Chang, Seoul (KR); Sungjin Kim, Seoul (KR); Juhwa Cheong, Seoul (KR); Junyong Ahn, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 317 days.

(21) Appl. No.: 15/196,743

(22) Filed: Jun. 29, 2016

(65) Prior Publication Data

US 2017/0005218 A1 Jan. 5, 2017

(30) Foreign Application Priority Data

Jun. 30, 2015 (KR) ........................ 10-2015-0093401

(51) Int. Cl.
| | |
|---|---|
| *H01L 31/0745* | (2012.01) |
| *H01L 31/0224* | (2006.01) |
| *H01L 31/18* | (2006.01) |
| *H01L 31/0288* | (2006.01) |
| *H01L 31/0216* | (2014.01) |
| *H01L 31/0236* | (2006.01) |
| *H01L 31/0368* | (2006.01) |

(52) U.S. Cl.
CPC ...... *H01L 31/0745* (2013.01); *H01L 31/0288* (2013.01); *H01L 31/02167* (2013.01); *H01L 31/02363* (2013.01); *H01L 31/022425* (2013.01); *H01L 31/03685* (2013.01); *H01L 31/182* (2013.01); *H01L 31/1824* (2013.01); *H01L 31/1864* (2013.01); *Y02E 10/546* (2013.01); *Y02P 70/521* (2015.11)

(58) Field of Classification Search
None
See application file for complete search history.

(56) References Cited

U.S. PATENT DOCUMENTS

| | | | |
|---|---|---|---|
| 5,332,689 | A | 7/1994 | Sandhu et al. |
| 5,541,137 | A | 7/1996 | Manning et al. |
| (Continued) | | | |

FOREIGN PATENT DOCUMENTS

| | | |
|---|---|---|
| EP | 0639856 A1 | 2/1995 |
| EP | 2846363 A2 | 3/2015 |
| (Continued) | | |

OTHER PUBLICATIONS

Yan et al., "Phosphorus-diffused polysilicon contacts for solar cells," Solar Energy Materials & Solar Cells, vol. 142, 2015 (Available online Jun. 19, 2015), pp. 75-82.

*Primary Examiner* — Shannon M Gardner
(74) *Attorney, Agent, or Firm* — Birch, Stewart, Kolasch & Birch, LLP

(57) ABSTRACT

Disclosed is a solar cell including a semiconductor substrate, and a dopant layer disposed over one surface of the semiconductor substrate and having a crystalline structure different from that of the semiconductor substrate, the dopant layer including a dopant. The dopant layer includes a plurality of semiconductor layers stacked one above another in a thickness direction thereof, and an interface layer interposed therebetween. The interface layer is an oxide layer having a higher concentration of oxygen than that in each of the plurality of semiconductor layers.

13 Claims, 12 Drawing Sheets

(56) References Cited

U.S. PATENT DOCUMENTS

| | | |
|---|---|---|
| 2012/0318336 A1 | 12/2012 | Hekmatshoar-Tabari et al. |
| 2013/0247965 A1 | 9/2013 | Swanson et al. |
| 2015/0162483 A1 | 6/2015 | Weidman et al. |

FOREIGN PATENT DOCUMENTS

| | | |
|---|---|---|
| JP | 4-267368 A | 9/1992 |
| JP | 2000-353706 A | 12/2000 |
| JP | 2012-253091 A | 12/2012 |
| JP | 2015-50411 A | 3/2015 |

SOLAR CELL AND METHOD OF MANUFACTURING THE SAME

CROSS-REFERENCE TO RELATED APPLICATION

This application claims the priority benefit of Korean Patent Application No. 10-2015-0093401, filed on Jun. 30, 2015 in the Korean Intellectual Property Office, the disclosures of which are incorporated herein by reference.

BACKGROUND

1. Technical Field

Embodiments of the present inventive concept relate to a solar cell and a method of manufacturing the same, and more particularly, to a solar cell, which includes a dopant layer having a crystalline structure different from that of a semiconductor substrate, and a method of manufacturing the same.

2. Description of the Related Art

Recently, due to depletion of existing energy resources, such as oil and coal, interest in alternative sources of energy to replace the existing energy resources is increasing. Most of all, solar cells are popular next generation cells to convert sunlight into electrical energy.

Solar cells may be manufactured by forming various layers and electrodes based on some design. The efficiency of solar cells may be determined by the design of the various layers and electrodes. In order for solar cells to be commercialized, there is a demand for solar cells, which have the maximized efficiency and minimized manufacturing costs.

SUMMARY OF THE INVENTIVE CONCEPT

Therefore, the embodiments of the present inventive concept have been made in view of the above problems, and it is an object of the present inventive concept to provide a solar cell having excellent efficiency and high productivity and a method of manufacturing the same.

In accordance with one aspect of the present inventive concept, the above and other objects can be accomplished by the provision of a solar cell including a semiconductor substrate, and a dopant layer disposed over one surface of the semiconductor substrate and having a crystalline structure different from that of the semiconductor substrate, the dopant layer including a dopant. The dopant layer includes a plurality of semiconductor layers stacked one above another in a thickness direction thereof, and an interface layer interposed therebetween. The interface layer is an oxide layer having a higher concentration of oxygen than that in each of the plurality of semiconductor layers.

BRIEF DESCRIPTION OF THE DRAWINGS

The above and other objects, features and other advantages of the present inventive concept will be more clearly understood from the following detailed description taken in conjunction with the accompanying drawings, in which.

DETAILED DESCRIPTION OF THE EMBODIMENTS

Figure 1:
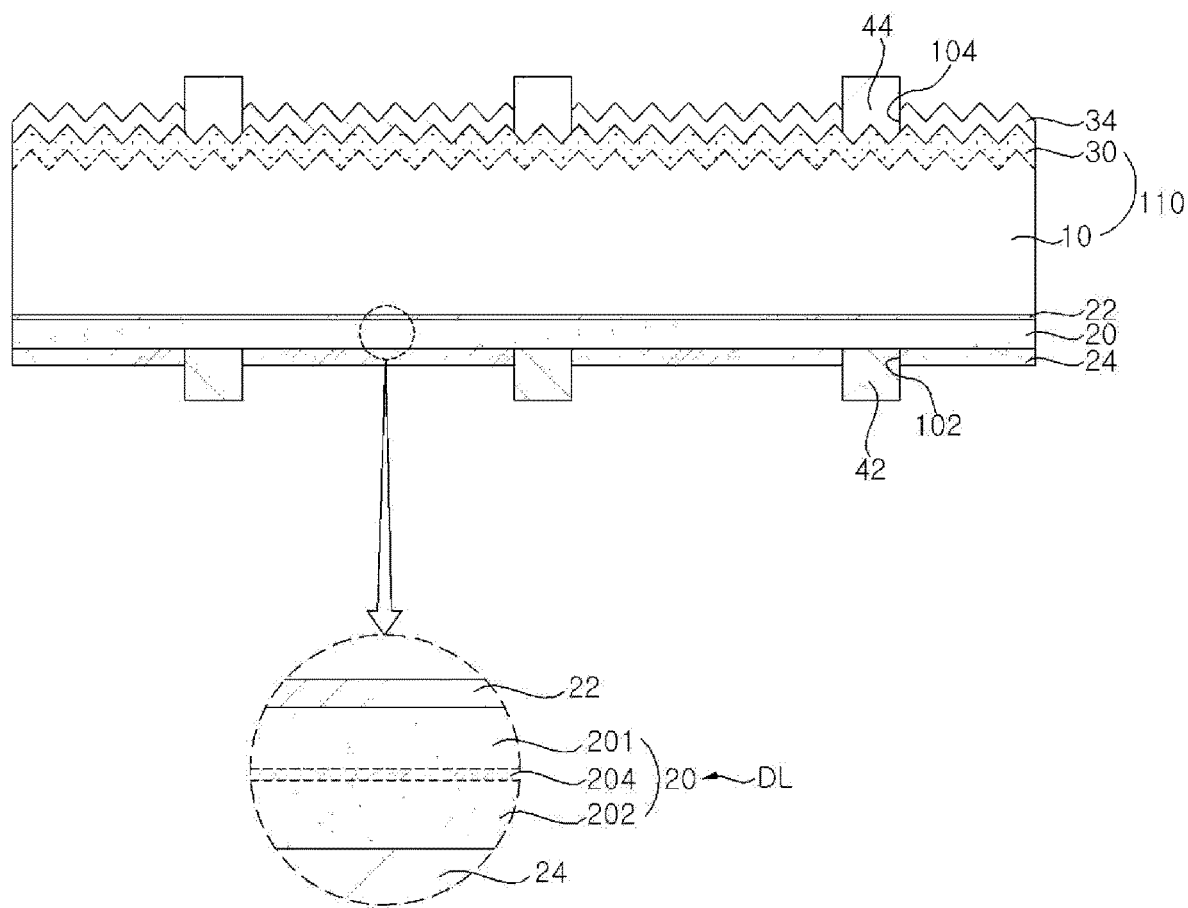
FIG. 1 is a sectional view illustrating a solar cell in accordance with an embodiment of the present inventive concept.

Reference will now be made in detail to the embodiments of the present inventive concept, examples of which are illustrated in the accompanying drawings. However, it will be understood that the present inventive concept should not be limited to the embodiments and may be modified in various ways.

In the drawings, to clearly and briefly explain the embodiments of the present inventive concept, illustration of elements having no connection with the description is omitted, and the same or extremely similar elements are designated by the same reference numerals throughout the specification. In addition, in the drawings, for more clear explanation, the dimensions of elements, such as thickness, width, and the like, are exaggerated or reduced, and thus the thickness, width, and the like of the embodiments of the present inventive concept are not limited to the illustration of the drawings.

In the entire specification, when an element is referred to as "including" another element, the element should not be understood as excluding other elements so long as there is no special conflicting description, and the element may include at least one other element. In addition, it will be understood that, when an element such as a layer, film, region or substrate is referred to as being "on" another element, it can be directly on the other element or intervening elements may also be present. On the other hand, when an element such as a layer, film, region or substrate is referred to as being "directly on" another element, this means that there are no intervening elements therebetween.

Hereinafter, a solar cell and a method of manufacturing the same in accordance with the embodiments of the present inventive concept will be described in detail with reference to the accompanying drawings.

Figure 2:
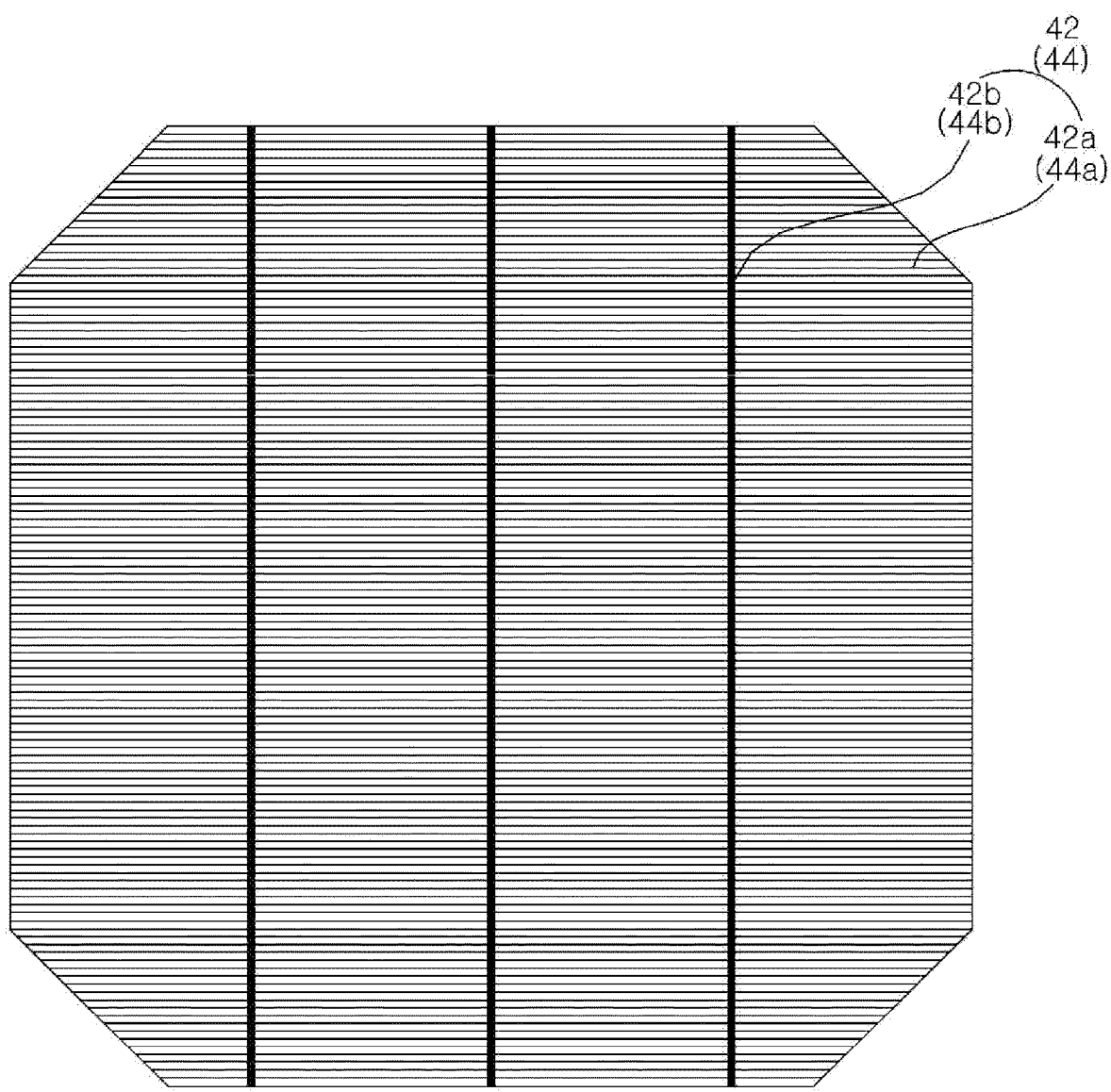
FIG. 2 is a plan view of the solar cell illustrated in FIG. 1.

FIG. 1 is a sectional view illustrating a solar cell in accordance with an embodiment of the present inventive concept, and FIG. 2 is a plan view of the solar cell illustrated in FIG. 1. In FIG. 2, illustration is focused on a semiconductor substrate and electrodes.

Referring to FIG. 1, the solar cell, designated by reference numeral 100, includes a semiconductor substrate 110, and a dopant layer DL including a dopant, the dopant layer DL being disposed over one surface of the semiconductor substrate 110 and having a crystalline structure different from that of the semiconductor substrate 110. The dopant in the dopant layer DL may be of the same conductive type as that of the semiconductor substrate 110, and may be included at a higher doping concentration than that in the semiconductor substrate 110, or may be of a conductive type different from that of the semiconductor substrate 110. The dopant layer DL may configure conductive areas 20 and 30, which are connected to electrodes 42 and 44, like an emitter area or a back surface field area, or may configure a field area 50 (FIG. 9) that is not connected to the electrodes 42 and 44. The conductive areas 20 and 30 may include a first conductive area 20 of a first conductive type, and a second conductive area 30 of a second conductive type. The electrodes 42 and 44 include a first electrode 42 connected to the first conductive area 20 and a second electrode 44 connected to the second conductive area 30. The field area 50 may not be provided in some embodiments.

In one example, in the present embodiment, the solar cell 100 may include the first conductive area 20, which is disposed over one surface of the semiconductor substrate 110 and is of the first conductive type, and the second conductive area 30, which is disposed over the other surface of the semiconductor substrate 110 and is of the second conductive type, and the dopant layer DL may be the first conductive area 20. In addition, the field area 50 is not separately provided. This will be described below in more detail.

The semiconductor substrate 110 may be formed of crystalline semiconductors including a single semiconductor material (e.g. group-IV elements). In one example, the semiconductor substrate 110 may be formed of monocrystalline or polycrystalline semiconductors (e.g. monocrystalline or polycrystalline silicon). In particular, the semiconductor substrate 110 may be formed of monocrystalline semiconductors (e.g. a monocrystalline semiconductor wafer, and more specifically, a semiconductor silicon wafer). When the semiconductor substrate 110 is formed of monocrystalline semiconductors (e.g. monocrystalline silicon), the solar cell 100 may achieve excellent electrical properties because the solar cell 100 is based on the semiconductor substrate 110 formed of monocrystalline semiconductors, which have few defects attributable to their high crystallinity.

The front surface and/or the back surface of the semiconductor substrate 110 may be subjected to texturing so as to form protrusions thereon. In one example, the protrusions may take the form of pyramids having irregular sizes, and the outer surface of the protrusions may be configured by (111) faces of the semiconductor substrate 110. When the protrusions are formed on, for example, the front surface of the semiconductor substrate 110 via texturing so that the roughness of the front surface is increased, the reflectance of light introduced through, for example, the front surface of the semiconductor substrate 110 may be reduced. Accordingly, the quantity of light, which reaches a pn junction formed by a base area 10 and the first or second conductive area 20 or 30, may be increased, which may minimize the loss of light. The present embodiment illustrates the protrusions formed on the front surface of the semiconductor substrate 110. In particular, because the front surface of the semiconductor substrate 110 is provided with the protrusions and the back surface of the semiconductor substrate 110 is subjected to mirror surface grinding, the reflection of light may be minimized on the front surface, into which a relatively large quantity of light is introduced, and the first conductive area 20 may be stably formed on the back surface. However, the embodiment of the present inventive concept is not limited thereto. Thus, protrusions may be formed on both the front surface and the back surface of the semiconductor substrate 110. Alternatively, no protrusions may be formed on both the front surface and the back surface of the semiconductor substrate 110.

In the present embodiment, the semiconductor substrate 110 includes the base area 10 in which a first or second conductive dopant is doped at a relatively low concentration so that the base area 10 is of the first or second conductive type. At this time, the base area 10 of the semiconductor substrate 110 may have a lower doping concentration, higher resistance, or lower carrier concentration than one of the first and second conductive areas 20 and 30, which is of the same conductive type as that of the base area 10.

The first conductive area 20 of the first conductive type may be disposed over one surface (e.g. the back surface) of the semiconductor substrate 110. In one example, a tunneling layer 22 may be formed over the semiconductor substrate 110, and the first conductive area 20 may be formed over the tunneling layer 22.

In one example, the tunneling layer 22 may be formed so as to come into contact with the back surface of the semiconductor substrate 110, which may result in a simplified configuration and improved tunneling effects. At this time, the tunneling layer 22 may be formed throughout the back surface of the semiconductor substrate 110. Here, the expression "formed throughout the surface" includes the meaning of being physically completely formed over the entire surface as well as the meaning of being formed so as to inevitably exclude a portion of the surface. Thereby, the tunneling layer 22 may be easily formed because a separate patterning process is not required. However, the embodiment of the present inventive concept is not limited thereto.

The tunneling layer 22 may serve as a barrier for electrons and holes, thereby preventing minority carriers from passing therethrough and allowing only majority carriers, which accumulate at a portion adjacent to the tunneling layer 22 and thus have a given amount of energy or more, to pass therethrough. At this time, the majority carriers, which have the given amount of energy or more, may easily pass through the tunneling layer 22 owing to tunneling effects. In addition, the tunneling layer 22 may serve as a diffusion barrier, which prevents the dopant of the conductive areas 20 and 30 from diffusing to the semiconductor substrate 110. The tunneling layer 22 may comprise various materials to enable the tunneling of the majority carriers. In one example, the tunneling layer 22 may comprise oxides, nitrides, semiconductors, and conductive polymers. In particular, the tunneling layer 22 may be a silicon oxide layer comprising a silicon oxide. This is because the silicon oxide layer has excellent passivation and thus ensures easy tunneling of carriers.

In order to achieve sufficient tunneling effects, the thickness of the tunneling layer 22 may be less than the thicknesses of the first and second passivation films 24 and 34 and the thickness of the first or second conductive area 20 or 30. In one example, the thickness of the tunneling layer 22 may be 2 nm or less, for example, within a range from 0.1 nm to 1.5 nm (more specifically, within a range from 0.5 nm to 1.5 nm). When the thickness of the tunneling layer 22 exceeds 2 nm, smooth tunneling does not occur, and consequently, the efficiency of the solar cell 100 may be deteriorated. When the thickness of the tunneling layer 22 is below 0.1 nm, it may be difficult to form the tunneling layer 22 having the desired quality. Accordingly, in order to ensure that the tunneling layer 22 exerts sufficient effects or have desired or certain characteristics, the thickness of the tunneling layer 22 may be within a range from 0.1 nm to 1.5 nm (more specifically, within a range from 0.5 nm to 1.5 nm). However, the embodiment of the present inventive concept is not limited thereto, and the thickness of the tunneling layer 22 may have any of various values.

The first conductive area 20 may include a first conductive dopant, and thus may be of the first conductive type. In one example, the first conductive area 20 may be formed so as to come into contact with the tunneling layer 22, which may simplify the configuration of the solar cell 100 and maximize the tunneling effects of the tunneling layer 22. However, the embodiment of the present inventive concept is not limited thereto.

The first conductive area 20 may comprise the same semiconductor material as the semiconductor substrate 110 (more specifically, a single semiconductor material, for example, silicon). As such, the first conductive area 20 may have properties similar to the semiconductor substrate 110, and thus may minimize a difference in properties that may occur when the first conductive area 20 and the semiconductor substrate 110 comprise different semiconductor materials. However, because the first conductive area 20 is formed over the semiconductor substrate 110 separately from the semiconductor substrate 110, the first conductive area 20 may have a crystalline structure different from that of the semiconductor substrate 110, in order to be easily formed over the semiconductor substrate 110.

For example, the first conductive area 20 may be formed by doping amorphous semiconductors, microcrystalline semiconductors, or polycrystalline semiconductors (e.g. amorphous silicon, microcrystalline silicon, or polycrystalline silicon), which may be easily manufactured via various methods, such as deposition, with a first conductive dopant. In particular, the first conductive area 20 may comprise polycrystalline semiconductors (e.g. polycrystalline silicon). As such, the first conductive area 20 may have excellent electrical conductivity, thus ensuring the smooth movement of carriers, and may cause the tunneling of carriers to occur efficiently in the tunneling layer 22, which is formed of, for example, an oxide. In particular, because polycrystalline semiconductors have a low deposition rate, the effect of increasing the rate of deposition of the first conductive area 20 or the dopant layer DL may be magnified.

In the present embodiment, the first conductive area 20, which is the dopant layer DL, includes a plurality of semiconductor layers 201 and 202 stacked one above another in a thickness direction over the semiconductor substrate 110 with an interface layer 204 interposed therebetween. In one example, the present embodiment illustrates that the first conductive area 20 includes a single interface layer 204, and a first layer 201 and a second layer 202 disposed with the interface layer 204 interposed therebetween. The following description related to the first layer 201 or the second layer 202 may be applied to the semiconductor layers 201 and 202. The interface layer 204 may have a different material or composition from that of the first layer 201 and the second layer 202, thus being distinguished from the first layer 201 and the second layer 202. In the present embodiment, the interface layer 204 may be configured as an oxide layer, which has a higher oxygen concentration than that in the first layer 201 and the second layer 202.

More specifically, each of the first layer 201 and the second layer 202 may be formed of a semiconductor material doped with a first conductive dopant, and the interface layer 204 may be a semiconductor oxide layer formed via combination of a semiconductor material and oxygen (e.g. a silicon oxide layer when the semiconductor material is silicon).

The interface layer 204 may be configured as a surface, which is orthogonal to the thickness direction of the semiconductor substrate 110, and may be formed so as to come into contact with the semiconductor layers 201 and 202 adjacent thereto (i.e. in the present embodiment, the first layer 201 and the second layer 202). More specifically, one surface of the interface layer 204 may wholly come into contact with the first layer 201, and the other surface of the interface layer 204 may wholly come into contact with the second layer 202. In the present embodiment, after the semiconductor layers 201 and 202 are formed using different process conditions so as to have different properties (in particular, different doping concentrations), the semiconductor layers 201 and 202 are subjected to heat treatment so as to form the first conductive area 20. In one example, one or one group of the semiconductor layers 201 and 202 may be formed so as to include a first conductive dopant and the other one or the other group may be formed so as not to include the first conductive dopant, and then the first conductive dopant may wholly diffuse in a heat treatment process, whereby the first conductive area 20 may be formed. At this time, a thin native oxide layer is formed to configure the interface layer 204 between the semiconductor layers 201 and 202 because process conditions, properties and the like change when the semiconductor layers 201 and 202 are formed. A detailed manufacturing process will be described later in detail with reference to FIGS. 3A to 3I.

The concentration of oxygen in the interface layer 204 may be higher than the concentration of oxygen in each of the first layer 201 and the second layer 202, and may be lower than the concentration of oxygen in the tunneling layer 22. This is because the interface layer 204 is a native layer generated inartificially or naturally in the manufacturing process, and the tunneling layer 22 is an artificial layer formed by injecting oxygen.

In one example, the concentration of oxygen in the interface layer 204 may be at least 1.5 times the concentration of oxygen in each of the first layer 201 and the second layer 202. This is because the interface layer 204 may require a concentration of oxygen of at least 1.5 times that in each of the first layer 201 and the second layer 202 in order to be detected as an oxide layer, which has a different constituent material or composition from that of the first layer 201 and the second layer 202 and thus is distinguished from the first layer 201 and the second layer 202. More specifically, the concentration of oxygen in the interface layer 204 may be within a range from 2 times to 10 times the concentration of oxygen in each of the first layer 201 and the second layer 202. In addition, because the concentration of oxygen in the tunneling layer 22 may be approximately 100 times the concentration of oxygen in each of the first layer 201 and the second layer 202, the concentration of oxygen in the tunneling layer 22 may be within a range from 10 times to 50 times the concentration of oxygen in the interface layer 204. The concentration of oxygen is limited to the range that may appear in the tunneling layer 22, which is formed in the deposition process for forming the oxide layer, and the interface layer 204, which is a native oxide layer. However, the embodiment of the present inventive concept is not limited thereto, and the concentration of oxygen in the interface layer 204 may change according to, for example, process conditions in the process of manufacturing the first conductive area 20, which is the dopant layer DL, the constituent materials of the tunneling layer 22, and process conditions in the process of manufacturing the tunneling layer 22.

The thickness of the interface layer 204 may be less than the thickness of each of the first layer 201 and the second layer 202, and may be equal to or less than the thickness of the tunneling layer 22. This is because the interface layer 204 is a native layer (or a naturally generated) generated in the manufacturing process, and the first layer 201, the second layer 202, and the tunneling layer 22 are layers artificially formed so as to have appropriate thicknesses.

In particular, the thickness of the interface layer 204 may be less than the thickness of the tunneling layer 22. This is because the tunneling layer 22 is thin, but is artificially grown, whereas the interface layer 204 is a native layer. In one example, the ratio of the thickness of the tunneling layer 22 to the thickness of the interface layer 204 may be within a range from 1:0.1 to 1:0.8 (e.g. within a range from 1:0.3 to 1:0.6). This thickness range may ensure that the interface layer 204 causes no great deterioration in the properties of the first conductive area 20.

In one example, the thickness of the interface layer 204 may be 2 nm or less (more specifically, 1 nm or less, for example, within a range from 0.2 nm to 1 nm). This thickness may be realized in a native oxide layer. In addition, the thickness of the first layer 201 or the second layer 202 may be within a range from 20 nm to 500 nm. When the thickness of the first layer 201 or the second layer 202 is below 20 nm, the process time for forming the first conductive area 20 may be increased and the forming process may be complicated because it is difficult to impart the first conductive area 20 with sufficient thickness, or it is necessary to increase the number of the semiconductor layers 201 and 202. When the thickness of the first layer 201 or the second layer 202 exceeds 500 nm, the thickness of the first conductive area 20 is excessively increased, and consequently, the process time may be increased and the process may be complicated. However, the embodiment of the present inventive concept is not limited thereto, and the thickness of the interface layer 204, the thicknesses of the first layer 201 and the second layer 202, and the like may have various values.

FIG. 1 illustrates that the first layer 201 and the second layer 202 have the same thickness or similar thicknesses (e.g. thicknesses having a difference within 10%). As such, the interface layer 204 may be spaced apart from the surface of the first conductive area 20 by a distance within a range from 40% to 60% of the total thickness of the first conductive area 20. Thereby, in the manufacturing process, the first conductive dopant, which is included in any one semiconductor layer among the semiconductor layers 201 and 202, may effectively diffuse to the other semiconductor layer, which includes no first conductive dopant.

In another example, the difference between the thicknesses of the first layer 201 and the second layer 202 may be 10% or more. This is because a specific semiconductor layer may be formed so as to be thick or thin in consideration of the process time, the uniform diffusion of the first conductive dopant, and the like. This will be described in more detail with regard to the method of manufacturing the solar cell.

In the present embodiment, the interface layer 204 may notify that the first conductive area 20, which is the dopant layer DL, has been manufactured by a simplified manufacturing process. In addition, when the interface layer 204 is present in the first conductive area 20, which is configured as an oxide layer, the interface layer 204 may serve as a barrier for preventing an excessively great quantity of the first conductive dopant from diffusing. Thereby, it is possible to prevent the first conductive dopant from passing through the tunneling layer 22, thereby diffusing to the semiconductor substrate 110. In particular, when the tunneling layer 22 is made thin in order to increase the probability of tunneling, the first conductive dopant may diffuse to the inside of the semiconductor substrate 110, which is problematic. This problem may be prevented when the interface layer 204 is provided inside the first conductive area 20 so as to prevent the first conductive dopant from diffusing too far.

The present embodiment illustrates that the first conductive area 20, which is the dopant layer DL, includes one interface layer 204 and two semiconductor layers 201 and 202 (i.e. the first layer 201 and the second layer 202) coming into contact with both surfaces of the interface layer 204. As such, the first conductive area 20 may be formed so as to have a simplified structure. However, the embodiment of the present inventive concept is not limited thereto. Thus, in an alternative embodiment, the first conductive area 20 may include a plurality of interface layers 204 (i.e. two or more interface layers 204), and three or more semiconductor layers 201 and 202, which are disposed with the respective interface layers 204 interposed therebetween. This will be described later in detail with reference to FIG. 5.

In the present embodiment, the first conductive area 20 is formed separately from the semiconductor substrate 110, which may reduce defects or deterioration in open-circuit voltage caused when a doped area is formed inside the semiconductor substrate 110. Thereby, the open-circuit voltage of the solar cell 100 may be increased.

The second conductive area 30, which is of the second conductive type, may be disposed on the other surface (e.g. the front surface) of the semiconductor substrate 110. In one example, in the present embodiment, the second conductive area 30 may be configured as a doped area, which is formed by doping a portion of the semiconductor substrate 110 with a second conductive dopant. As such, the base area 10 and the second conductive area 30 may have the same crystalline structure and may comprise the same semiconductor material as the semiconductor substrate 110, but may be of different conductive types or may have different doping concentrations from each other. Specifically, when the base area 10 is of the first conductive type, the base area 10 and the second conductive area 30 are of different conductive types. When the base area 10 is of the second conductive type, the doping concentration in the second conductive area 30 is higher than the doping concentration in the base area 10.

When the base area 10 is of the first conductive type, the first conductive area 20 of the first conductive type configures a back surface field area for forming a back surface field (BSF), which is of the same conductive type as that of the semiconductor substrate 110 and has a higher doping concentration than that in the semiconductor substrate 110, and the second conductive area 30 configures an emitter area, which is of a conductive type different from that of the base area 10, thus forming a pn junction with the base area 10. As such, the second conductive area 30, which configures the emitter area, is disposed on the front surface of the semiconductor substrate 110, which may minimize an optical path of light reaching the pn junction.

However, the embodiment of the present inventive concept is not limited thereto. In another example, when the base area 10 is of the second conductive type, the first conductive area 20 configures an emitter area, and the second conductive area 30 configures a front surface field area for forming a front surface field (FSF), which is of the same conductive type as that of the semiconductor substrate 110 and has a higher doping concentration than that in the semiconductor substrate 110.

A p-type dopant, which is used as the first or second conductive dopant, may be selected from among group III elements, such as boron (B), aluminum (Al), gallium (Ga) and indium (In), and an n-type dopant may be selected from among group V elements, such as phosphorus (P), arsenic (As), bismuth (Bi) and antimony (Sb). However, the embodiment of the present inventive concept is not limited thereto, and any of various dopants may be used as the first or second dopant.

Here, in the present embodiment, the first conductive area 20, which is formed separately from the semiconductor substrate 110, is disposed on the back surface of the semiconductor substrate 110, and the second conductive area 30, which configures a portion of the semiconductor substrate 110, is disposed on the front surface of the semiconductor substrate 110. When the first conductive area 20, which has a crystalline structure different from that of the semiconductor substrate 110, is disposed on the front surface of the semiconductor substrate 110, the absorption of light is increased in the first conductive area 20, which may reduce the quantity of light reaching the pn junction. For this reason, the first conductive area 20 is disposed on the back surface of the semiconductor substrate 110. However, the embodiment of the present inventive concept is not limited thereto. An alternative embodiment related to this will be described below in detail with reference to FIG. 7.

In addition, the present embodiment illustrates that one of the first and second conductive areas 20 and 30 (i.e. the first conductive area 20) has a crystalline structure different from that of the semiconductor substrate 110. However, the embodiment of the present inventive concept is not limited thereto. An alternative embodiment will be described later in more detail with reference to FIG. 8.

An insulation film may be formed throughout the first and second conductive areas 20 and 30 excluding openings 102 and 104, which correspond to the first and second electrodes 42 and 44. Specifically, a first passivation film (or anti-reflection film or reflection film) 24 may be formed throughout the first conductive area 20 excluding the openings 102, and the second passivation film (or anti-reflection film) 34 may be formed throughout the second conductive area 30 excluding the openings 104.

The first passivation film 24 and/or the second passivation film 34 may be configured as a single film or multiple films according to desired functions.

The first passivation film 24, disposed on the back surface of the semiconductor substrate 110, may include an anti-reflection film or reflection film according to the configuration of the solar cell 100, and/or may include a layer for passivation in order to prevent surface recombination, a capping layer for preventing contamination or damage to the semiconductor substrate 110, or the like.

In one example, the second passivation film 34, disposed on the front surface of the semiconductor substrate 110, may include an anti-reflection film, or may be formed of an anti-reflection film. As such, the reflectance of light introduced into the front surface of the semiconductor substrate 110 may be reduced, whereby the quantity of light reaching the pn junction, formed by the base area 10 and the first conductive area 20, may be increased. In this way, the short-circuit current of the solar cell 100 may be increased. In addition, the second passivation film 34 may additionally include a layer for passivation in order to prevent surface recombination, or a capping layer for preventing contamination or damage to the semiconductor substrate 110.

The first passivation film 24 and/or the second passivation film 34 may be formed of various materials. In one example, the first passivation film 24 and/or the second passivation film 34 may be a single film or multiple films having the form of a combination of two or more films selected from among the group of a silicon nitride film, a silicon nitride film containing hydrogen, a silicon oxide film, a silicon oxide nitride film, an aluminum oxide film, $MgF_2$, ZnS, $TiO_2$ and $CeO_2$. However, the embodiment of the present inventive concept is not limited thereto, and of course the first passivation film 24 and/or the second passivation film 34 may be formed of various materials.

The first electrode 42 is disposed over (e.g. in contact with) the first conductive area 20 so as to be electrically connected to the first conductive area 20. The first electrode 42 may be electrically connected to the first conductive area 20 through the opening 102 formed in the first passivation film 24 (i.e. by penetrating the first passivation film 24). Similarly, the second electrode 44 is disposed over (e.g. in contact with) the second conductive area 20 so as to be electrically connected to the second conductive area 30. The second electrode 44 may be electrically connected to the second conductive area 30 through the opening 104 formed in the second passivation film 34 (i.e. by penetrating the second passivation film 34). The first and second electrodes 42 and 44 may comprise various materials (more specifically, metals) and may have various shapes. The shapes of the first and second electrodes 42 and 44 will be described in detail with reference to FIG. 2.

The plan shape of the first and second electrodes 42 and 44 will be described in detail with reference to FIG. 2.

Referring to FIG. 2, the first and second electrodes 42 and 44 may include a plurality of finger electrodes 42a and 44a, which are spaced apart from one another at a constant pitch. Although FIG. 2 illustrates that the finger electrodes 42a and 44a are parallel to one another and are also parallel to the edge of the semiconductor substrate 110, the embodiment of the present inventive concept is not limited thereto. In addition, the first and second electrodes 42 and 44 may include bus bar electrodes 42b and 44b, which are formed in the direction crossing the finger electrodes 42a and 44a so as to connect the finger electrodes 42a and 44a to one another. Only one bus bar electrode 42b or 44b may be provided, or a plurality of bus bar electrodes 42b or 44b may be arranged at a larger pitch than the pitch of the finger electrodes 42a and 44a as illustrated in FIG. 2 by example. At this time, although the width of the bus bar electrodes 42b and 44b may be larger than the width of the finger electrodes 42a and 44a, the embodiment of the present inventive concept is not limited thereto. Accordingly, the width of the bus bar electrodes 42b and 44b may be equal to or less than the width of the finger electrodes 42a and 44a.

When viewing the cross section, both the finger electrode 42a and the bus bar electrode 42b of the first electrode 42 may be formed so as to penetrate the first passivation film 24. That is, the opening 102 may be formed so as to correspond to both the finger electrode 42a and the bus bar electrode 42b of the first electrode 42. In addition, both the finger electrode 44a and the bus bar electrode 44b of the second electrode 44 may be formed so as to penetrate the second passivation film 34. That is, the opening 104 may be formed so as to correspond to both the finger electrode 44a and the bus bar electrode 44b of the second electrode 44. However, the embodiment of the present inventive concept is not limited thereto. In another example, the finger electrode 42a of the first electrode 42 may be formed so as to penetrate the first passivation film 24 and the bus bar electrode 42b may be formed over the first passivation film 24. In this case, the opening 102 may have a shape corresponding to the shape of the finger electrode 42a, and may not be formed in a portion at which only the bus bar electrode 42b is located. In addition, the finger electrode 44a of the second electrode 44 may be formed so as to penetrate the second passivation film 34 and the bus bar electrode 44b may be formed over the second passivation film 34. In this case, the opening 104 may have a shape corresponding to the shape of the finger electrode 44a, and may not be formed in a portion at which only the bus bar electrode 44b is located.

FIG. 2 illustrates that the first electrode 42 and the second electrode 44 have the same plan shape. However, the embodiment of the present inventive concept is not limited thereto, and, for example, the width and pitch of the finger electrode 42a and the bus bar electrode 42b of the first electrode 42 may be different from the width and pitch of the finger electrode 44a and the bus bar electrode 44b of the second electrode 44. In addition, the first electrode 42 and the second electrode 44 may have different plan shapes, and various other alternative embodiments are possible.

In the present embodiment, as described above, the first and second electrodes 42 and 44 of the solar cell 100 have a given pattern so that the solar cell 100 has a bi-facial structure to allow light to be introduced into the front surface and the back surface of the semiconductor substrate 110. As such, the quantity of light for use in the solar cell 100 may be increased, which may contribute to improvement in the efficiency of the solar cell 100. However, the embodiment of the present inventive concept is not limited thereto, and the first electrode 42 may be formed throughout the back surface of the semiconductor substrate 110. Various other alternative embodiments are possible.

In the method of manufacturing the solar cell 100 in accordance with the present embodiment, the first conductive area 20, which is the dopant layer DL, may be formed within a short process time. This will be described in detail with reference to FIGS. 3A to 3I. That the first conductive area 20 is manufactured by the manufacturing method of the present embodiment can be appreciated from the fact that the first conductive area 20 includes the interface layer 204 as described above.

The method of manufacturing the solar cell 100 will be described in detail with reference to FIGS. 3A to 3I. A detailed description related to the content described above will be omitted, and only content not described above will be described in detail.

FIGS. 3A to 3I are sectional views illustrating a method of manufacturing a solar cell in accordance with an embodiment of the present inventive concept.

Figure 3A:
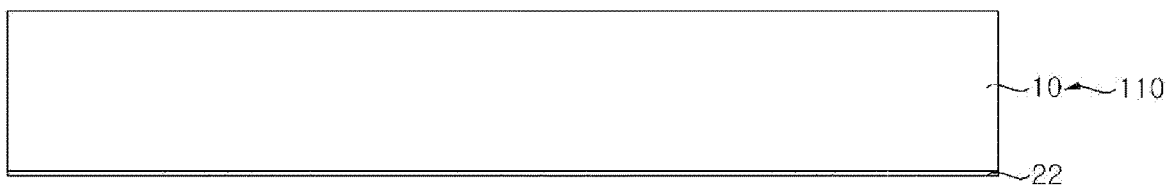
FIGS. 3A to 3I are sectional views illustrating a method of manufacturing a solar cell in accordance with an embodiment of the present inventive concept.

First, as illustrated in FIG. 3A, the tunneling layer 22 is formed on the back surface of the semiconductor substrate 110. The tunneling layer 22 may be formed throughout the back surface of the semiconductor substrate 110.

Here, the tunneling layer 22 may be formed via, for example, thermal growth or deposition (e.g. plasma enhanced chemical vapor deposition (PECVD), atomic layer deposition (ALD) or low pressure chemical vapor deposition (LPCVD)). However, the embodiment of the present inventive concept is not limited thereto, and the tunneling layer 22 may be formed via various other methods. In one example, the tunneling layer 22 may be formed of a silicon oxide layer.

Although FIG. 3A illustrates that the tunneling layer 22 is formed only on the back surface of the semiconductor substrate 110, the embodiment of the present inventive concept is not limited thereto. The tunneling layer 22 may additionally be formed on the front surface and/or the side surface of the semiconductor substrate 110 according to the method of forming the tunneling layer 22. The tunneling layer 22, which is formed on, for example, on the front surface of the semiconductor substrate 110, may be removed later in a separate operation (e.g. in a texturing process illustrated in FIG. 3D).

Subsequently, as illustrated in FIGS. 3B to 3G, the first conductive area 20 may be formed over the tunneling layer 22, and a texturing structure and the second conductive area 30 may be formed on the front surface of the semiconductor substrate 110. This will be described in more detail.

Figure 3B:
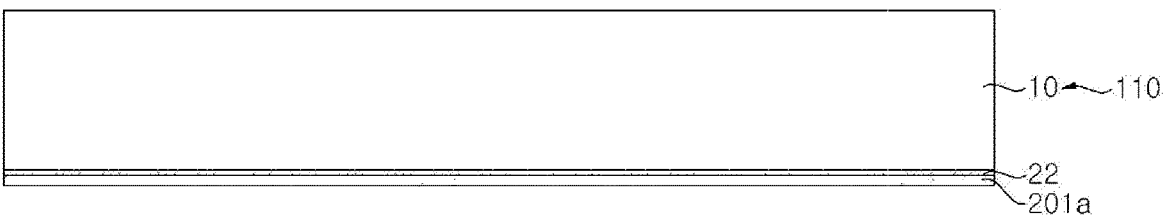
Figure 3C:
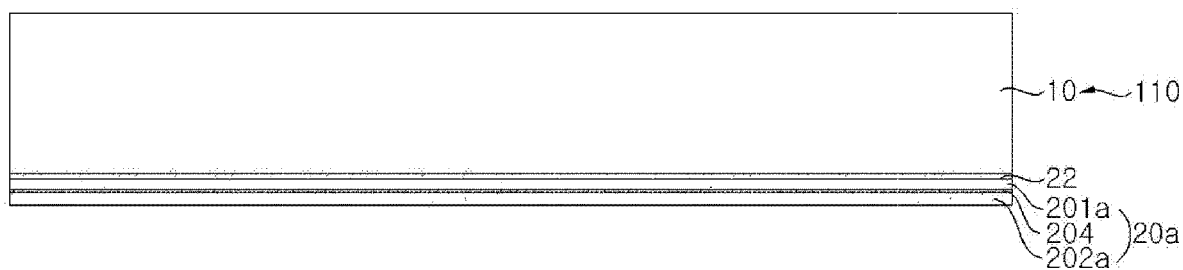

An undoped semiconductor layer 201a is formed over the tunneling layer 22 as illustrated in FIG. 3B, and a doped semiconductor layer 202a is formed over the undoped semiconductor layer 201a as illustrated in FIG. 3C. A process of forming the undoped semiconductor layer 201a and a process of forming the doped semiconductor layer 202a may be successively performed by changing supply target gas within the same apparatus. That is, a plurality of semiconductor layers 20a including the undoped semiconductor layer 201a and the doped semiconductor layer 202a may be formed via in-situ processes.

Here, the semiconductor layers 20a may be formed via, for example, thermal growth, deposition (e.g. plasma enhanced chemical vapor deposition (PECVD), atomic layer deposition (ALD) or low pressure chemical vapor deposition (LPCVD) (more particularly, LPCVD)). However, the embodiment of the present inventive concept is not limited thereto, and the semiconductor layers 20a may be formed via various other methods.

The process of forming the semiconductor layers 20a including the undoped semiconductor layer 201a and the doped semiconductor layer 202a (e.g. deposition) is performed at a higher temperature than that of the room temperature (e.g. a temperature of 600 degrees Celsius or more). As such, when changing the gas that is supplied in order to form the doped semiconductor layer 202a after the undoped semiconductor layer 201a is formed, oxygen gas inside the apparatus is decomposed by the high temperature, thereby being deposited over the undoped semiconductor layer 201a, in which state, the changed gas is supplied, thereby forming the doped semiconductor layer 202a. Thereby, the interface layer 204, which is an oxide layer having a relatively high concentration of oxygen, is provided between the undoped semiconductor layer 201a and the doped semiconductor layer 202a.

For example, when the undoped semiconductor layer 201a and the doped semiconductor layer 202a are formed via deposition, source gas including silicon (e.g. silane ($SiH_4$)) may be supplied when depositing the undoped semiconductor layer 201a, and source gas including silicon (e.g. silane ($SiH_4$)) and dopant gas including a first conductive dopant (e.g. $POCl_3$ or $B_2H_6$) may be supplied when depositing the doped semiconductor layer 202a. Generally, after gas, used for the deposition of the undoped semiconductor layer 201a, is discharged to the outside by, for example, purging, the gas to be used for the deposition of the doped semiconductor layer 202a is supplied. At this time, because oxygen, which is naturally introduced from the outside when a door of the apparatus is initially opened in order to introduce the semiconductor substrate 110 or upon purging, is present inside the apparatus, the oxygen inside the apparatus is deposited over the undoped semiconductor layer 201a, thereby forming the interface layer 204, and then the doped semiconductor layer 202a is formed over the interface layer 204.

At this time, the rate of forming the undoped semiconductor layer 201a, which includes no first conductive dopant, is greater than the rate of forming the doped semiconductor layer 202a, which includes the first conductive dopant. In one example, the rate of forming the undoped semiconductor layer 201a may be within a range from 10 nm/min to 20 nm/min, and the rate of forming the doped semiconductor layer 202a may be within a range from 1 nm/min to 5 nm/min. However, because this rate may change according to specific conditions of the deposition process, the embodiment of the present inventive concept is not limited thereto.

Figure 4:
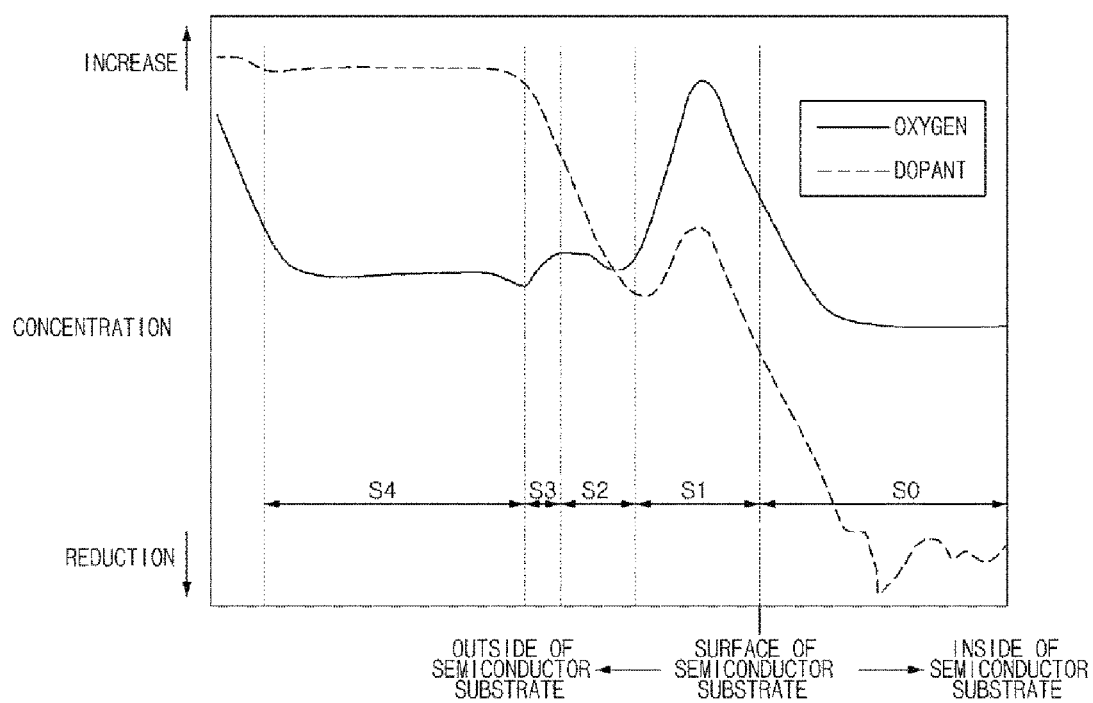
FIG. 4 is a graph illustrating the concentrations of a dopant and oxygen measured before heat treatment is performed.

The undoped semiconductor layer 201a, the doped semiconductor layer 202a, and the interface layer 204 will be described in more detail with reference to FIG. 4. FIG. 4 is a graph illustrating the concentrations of a dopant (i.e. the first conductive dopant) and oxygen, measured by secondary ion mass spectrometry (SIMS) after the semiconductor layers 20a including the undoped semiconductor layer 201a and the doped semiconductor layer 202a are formed. That is, FIG. 4 is a graph illustrating the concentrations of a dopant and oxygen measured prior to performing heat treatment.

Referring to FIG. 4, it can be appreciated that a first section S1 in which the tunneling layer 22 is located exhibits a higher concentration of oxygen than that in an inner section S0, which corresponds to the inside of the semiconductor substrate 110. In the first section S1, the concentration of a dopant has a slightly higher peak than that in the undoped semiconductor layer 201a. This is because the dopant may be condensed on the tunneling layer 22.

In a second section S2 in which the undoped semiconductor layer 201a is located, a portion adjacent to the doped semiconductor layer 202a has a doping concentration similar to that in the doped semiconductor layer 202a, and the doping concentration is gradually reduced with increasing distance from the doped semiconductor layer 202a (in the present embodiment, with decreasing distance to the semiconductor substrate 110). Although the undoped semiconductor layer 201a is formed via deposition without a dopant, the deposition is performed at a relatively high temperature. Therefore, the above-described doping profile is attained via the diffusion of dopant when the doped semiconductor layer 202a is deposited.

It can be appreciated that a third section S3 in which the interface layer 204 is located has a portion at which the concentration of oxygen is rapidly increased to a high value. Referring to FIG. 4, it can be appreciated that the concentration of oxygen in the interface layer 204 is lower than the concentration of oxygen in the tunneling layer 22, higher than the concentration of oxygen in the doped semiconductor layer 202a, and higher than the concentration of oxygen in the undoped semiconductor layer 201a. In addition, it can be appreciated that the thickness of the interface layer 204 is less than the thickness of each of the semiconductor layers 20a or the tunneling layer 22.

In a fourth section S4 in which the doped semiconductor layer 202a is located, the concentration of oxygen is generally low, and the doping concentration is relatively high and uniform (e.g. with a difference within 30%).

FIG. 4 illustrates that the thickness of the doped semiconductor layer 202a is greater than the thickness of the undoped semiconductor layer 201a. As such, by positioning the doped semiconductor layer 202a, having a high doping concentration, on a portion connected to the first electrode 42, the resistance of the first electrode 42 may be maintained at a low level even if the first conductive dopant does not smoothly diffuse due to process errors, etc. In addition, the first conductive dopant included in the doped semiconductor layer 202a may evenly diffuse throughout the undoped semiconductor layer 201a.

In another example, the undoped semiconductor layer 201a may be thicker than the doped semiconductor layer 202a. As such, the process time of the process of forming the first conductive area 20 may be reduced because the undoped semiconductor layer 201a, which is formed at a relatively high rate, is made thick and the doped semiconductor layer 202a, which is formed at a relatively low rate, is made thin.

Alternatively, as described above, the thickness of the undoped semiconductor layer 201a and the thickness of the doped semiconductor layer 202a may be the same as or similar to each other. Various other alternative embodiments are possible.

FIGS. 3B and 3C illustrate that one undoped semiconductor layer 201a is first formed, and then one doped semiconductor layer 202a is formed so that two semiconductor layers 20a are provided. As such, the semiconductor layers 20a include two layers, thus having a simplified configuration and being easily formed in a simplified process. In addition, because the doped semiconductor layer 202a, having a high doping concentration, is located on a portion connected to the first electrode 42, the resistance of the first electrode 42 may be maintained at a low level even if the first conductive dopant does not smoothly diffuse due to process errors, etc. However, the embodiment of the present inventive concept is not limited thereto. Various alternative embodiments will be described in detail with reference to FIG. 5.

Figure 5:
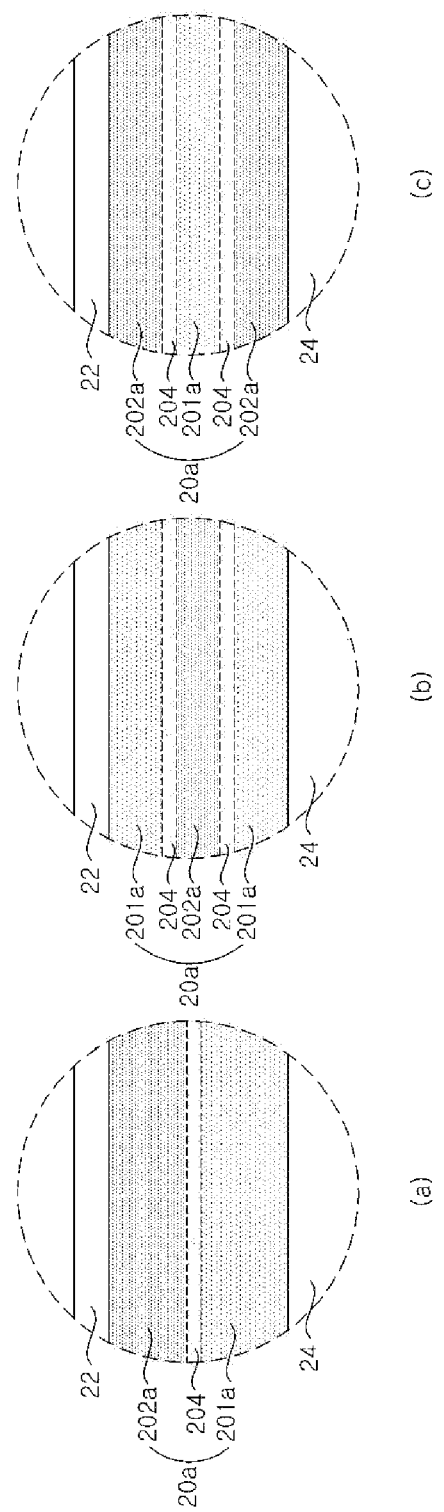
FIG. 5 is a view illustrating examples of a plurality of semiconductor layers of a solar cell in accordance with various alternative embodiments of the present inventive concept.

FIG. 5 is a view illustrating examples of the semiconductor layers 20a of the solar cell in accordance with various alternative embodiments of the present inventive concept. For clear and simplified description, FIG. 5 illustrates only the portion corresponding to the enlarged circle of FIG. 1.

Referring to (a) of FIG. 5, in one alternative embodiment, after the doped semiconductor layer 202a is first formed over the tunneling layer 22, the undoped semiconductor layer 201a is formed. At this time, the interface layer 204 is formed between the doped semiconductor layer 202a and the undoped semiconductor layer 201a. The doping concentration may be high and consistent in the doped semiconductor layer 202a formed over the tunneling layer 22, and may be gradually reduced in the undoped semiconductor layer 201a with increasing distance from the doped semiconductor layer 202a. In addition, the concentration of oxygen in the interface layer 204 may be higher than the concentration of oxygen in each of the undoped semiconductor layer 201a and the doped semiconductor layer 202a and may be lower than the concentration of oxygen in the tunneling layer 22.

Referring to (b) of FIG. 5, in another alternative embodiment, the undoped semiconductor layer 201a, the doped semiconductor layer 202a, and the undoped semiconductor layer 201a are formed in sequence over the tunneling layer 22. At this time, the interface layers 204 are formed respectively between the undoped semiconductor layer 201a adjacent to the tunneling layer 22 and the doped semiconductor layer 202a and between the doped semiconductor layer 202a and the undoped semiconductor layer 201a adjacent to the first passivation film 24. The doping concentration may be high and consistent in the doped semiconductor layer 202a, may be gradually reduced in the undoped semiconductor layer 201a adjacent to the tunneling layer 22 with increasing distance from the doped semiconductor layer 202a and decreasing distance to the tunneling layer 22, and may be gradually reduced in the undoped semiconductor layer 201a adjacent to the first passivation film 24 with increasing distance from the doped semiconductor layer 202a and decreasing distance to the first passivation film 24. In addition, the concentration of oxygen in each interface layer 204 may be higher than the concentration of oxygen in each of the two undoped semiconductor layers 201a and the doped semiconductor layer 202a, and may be lower than the concentration of oxygen in the tunneling layer 22.

Referring to (c) of FIG. 5, in a further alternative embodiment, the doped semiconductor layer 202a, the undoped semiconductor layer 201a, and the doped semiconductor layer 202a are formed in sequence over the tunneling layer 22. At this time, the interface layers 204 are formed respectively between the doped semiconductor layer 202a adjacent to the tunneling layer 22 and the undoped semiconductor layer 201a and between the undoped semiconductor layer 201a and the doped semiconductor layer 202a adjacent to the first passivation film 24. The doping concentration may be high and even in the two doped semiconductor layers 202a, and may be gradually reduced in the undoped semiconductor layer 201a located between the two doped semiconductor layers 202a with increasing distance from the respective doped semiconductor layers 202a. That is, the undoped semiconductor layer 201a may have a doping profile in which the doping concentration is gradually reduced with increasing distance from the doped semiconductor layer 202a adjacent to the tunneling layer 22 and then gradually increased with decreasing distance to the doped semiconductor layer 202a adjacent to the first passivation film 24. In addition, the concentration of oxygen in each interface layer 204 may be higher than the concentration of oxygen in each of the two doped semiconductor layers 202a and the undoped semiconductor layer 201a, and may be lower than the concentration of oxygen in the tunneling layer 22.

In accordance with the present alternative embodiment, the number of undoped semiconductor layers 201a may be greater than the number of doped semiconductor layers 202a, making the total thickness of undoped semiconductor layers 201a greater than the total thickness of doped semiconductor layers 202a. Thus, the process time of the semiconductor layers 20a may be reduced by increasing the occupation rate of the undoped semiconductor layer 201a, which has a fast growth rate. In addition, the number of doped semiconductor layers 202a may be greater than the number of undoped semiconductor layers 201a, so that each undoped semiconductor layer 201a is located between two doped semiconductor layers 202a. This may allow the dopant included in the doped semiconductor layer 202a to evenly diffuse to the undoped semiconductor layer 201a.

In FIG. 5, (b) and (c) illustrate that one of the doped semiconductor layer 202a and the undoped semiconductor layer 201a is formed into two layers and the other one is formed into a single layer. However, the embodiment of the present inventive concept is not limited thereto, and the number of the layers 201a and 202a are not limited so long as the doped semiconductor layer 202a and the undoped semiconductor layer 201a are alternately formed.

In the case where at least one of the doped semiconductor layer 202a and the undoped semiconductor layer 201a is provided in a plural number as described above, the sum of the thicknesses of the doped semiconductor layers 202a or the sum of the thicknesses of the undoped semiconductor layers 201a may be within a range from 20 nm to 500 nm. However, the embodiment of the present inventive concept is not limited thereto, and the doped semiconductor layers 202a or the undoped semiconductor layers 201a may have different thicknesses from that described above.

In addition, although (a) to (c) of FIG. 5 illustrate that the semiconductor layers 20a are formed only on the back surface of the semiconductor substrate 110, the embodiment of the present inventive concept is not limited thereto. The semiconductor layers 20a may additionally be formed on the front surface and/or the side surface of the semiconductor substrate 10 according to the manufacturing method thereof. The semiconductor layers 20a, which are formed on, for example, the front surface of the semiconductor substrate 110 and are actually not required, may be removed in a separate following operation (e.g. in a texturing process illustrated in FIG. 3D).

Figure 3D:
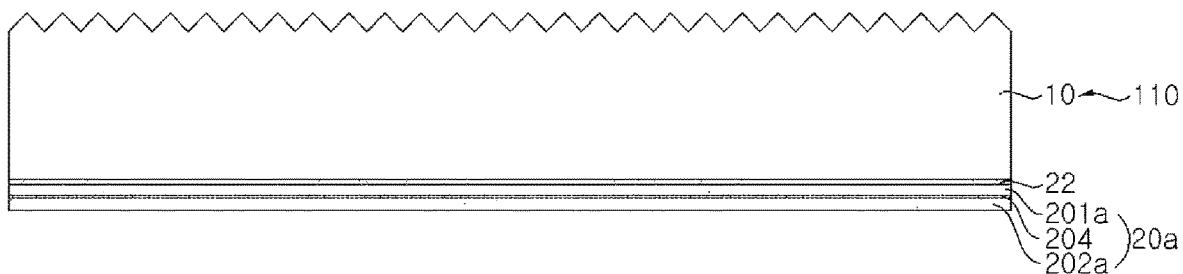

Subsequently, as illustrated in FIG. 3D, the front surface of the semiconductor substrate 110 may be subjected to texturing so that protrusions are formed on the front surface of the semiconductor substrate 110. The texturing performed on the surface of the semiconductor substrate 110 may be wet or dry texturing. Wet texturing may be performed by dipping the semiconductor substrate 110 into a texturing solution, and has the advantage of a short processing time. Dry texturing is the process of grinding the surface of the semiconductor substrate 110 using, for example, a diamond grill or laser, and may entail the disadvantages of a long processing time and the potential for damage to the semiconductor substrate 110, although it may be advantageous in that protrusions are formed evenly. In addition, the texturing on the semiconductor substrate 110 may be, for example, reactive ion etching (RIE). As such, in the embodiment of the present inventive concept, the semiconductor substrate 110 may be subjected to texturing via various methods.

The present embodiment illustrates that, after the semiconductor layers 20a for the formation of the first conductive area 20 are formed, the front surface of the semiconductor substrate 110 is subjected to texturing, after which the second conductive area 30 is formed or another layer for the formation of the second conductive area 30 is formed. However, the embodiment of the present inventive concept is not limited thereto. Accordingly, the process sequence of texturing the front surface of the semiconductor substrate 110 may be altered in various ways.

Figure 3E:
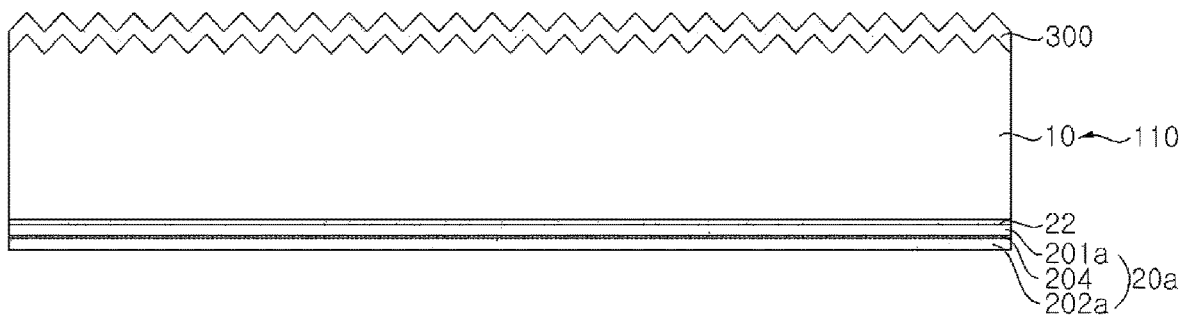

Subsequently, as illustrated in FIG. 3E, a doping layer 300 including a second conductive dopant is formed on the front surface of the semiconductor substrate 110 in order to form the second conductive area 30. The doping layer 300 may be any of various layers including the second conductive dopant. In one example, the doping layer 300 may be formed of phosphorous silicate glass (PSG) or boron silicate glass (BSG). The doping layer 300 formed of phosphorous silicate glass (PSG) or boron silicate glass (BSG) may be easily formed. However, the embodiment of the present inventive concept is not limited as to the constituent material of the doping layer 300.

Figure 3F:
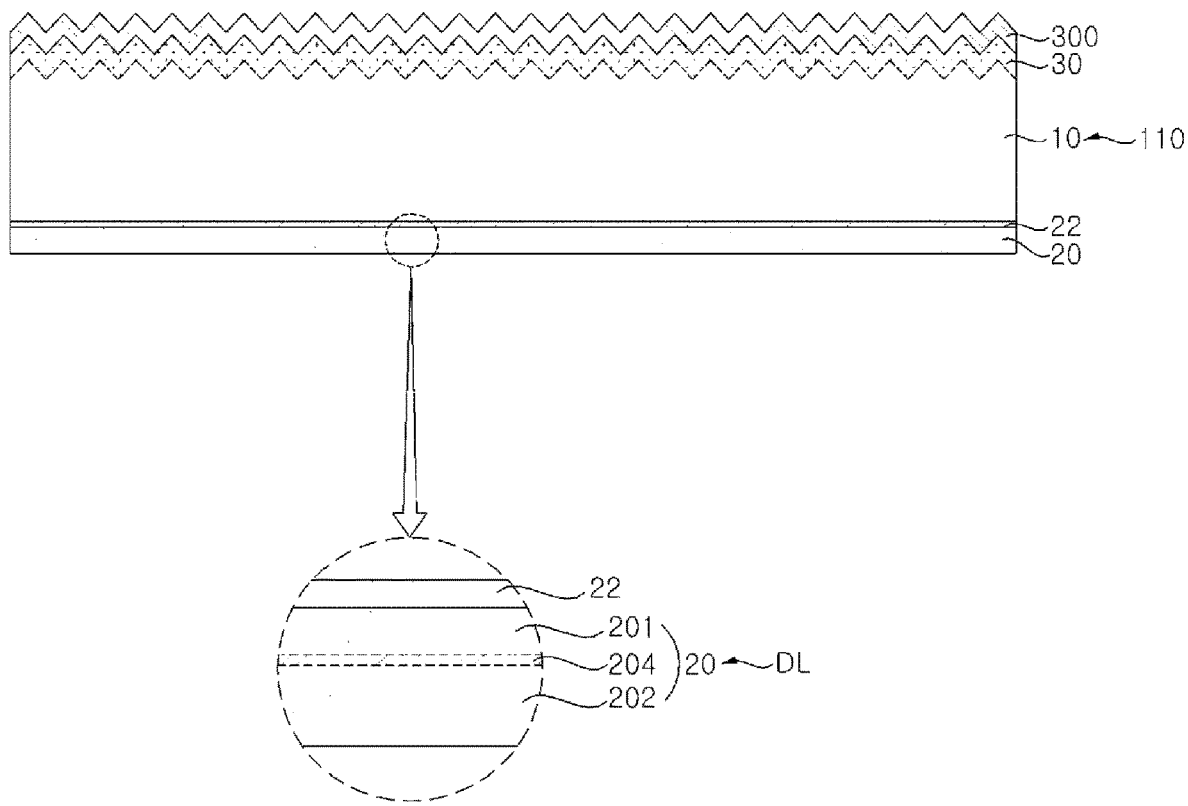

Subsequently, as illustrated in FIG. 3F, the first conductive area 20 is formed by diffusing the first conductive dopant in the doped semiconductor layer 202a (FIG. 3E) to the undoped semiconductor layer 201a (FIG. 3E) via heat treatment, and the second conductive area 30 is formed by diffusing the second conductive dopant in the doping layer 300 to the semiconductor substrate 110.

More specifically, the first conductive dopant in the doped semiconductor layer 202a diffuses to the undoped semiconductor layer 201a via heat treatment, such that the first layer 201 and the second layer 202, which have similar doping concentrations (e.g. doping concentrations having a difference within 30%), are formed with the interface layer 204 interposed therebetween. At this time, because the concentration of oxygen is not greatly changed even if heat treatment is performed, the interface layer 204 having a relatively high concentration of oxygen is maintained between the first layer 201 and the second layer 202.

The heat treatment process may be performed in any of various heat treatment apparatuses, and in one example, may be performed at a temperature of 900 degrees Celsius or more (e.g. a temperature within a range from 900 degrees Celsius to 1300 degrees Celsius). However, the embodiment of the present inventive concept is not limited as to the heat treatment apparatus, the temperature thereof, or the like.

Figure 6:
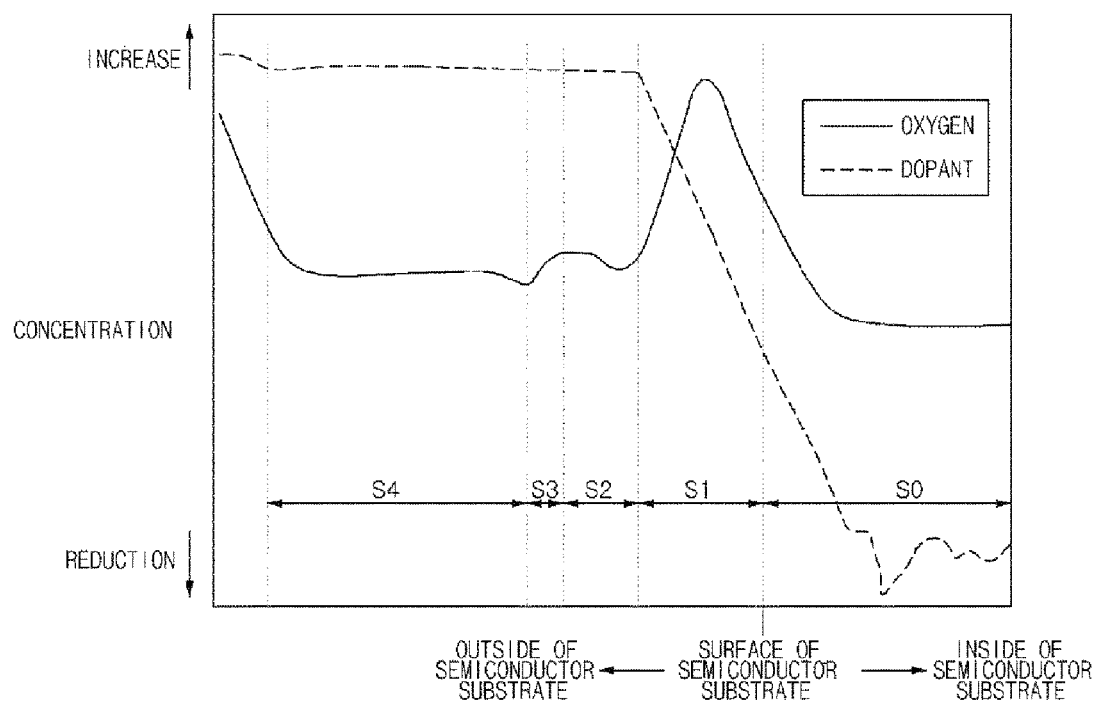
FIG. 6 is a graph illustrating the concentrations of a dopant and oxygen measured after heat treatment is performed.

The first layer 201, the second layer 202, and the interface layer 204 interposed therebetween, which are formed via heat treatment, will be described in more detail with reference to FIG. 6. FIG. 6 is a graph illustrating the concentrations of a dopant (i.e. a first conductive dopant) and oxygen measured by SIMS in the first layer 201, the second layer 202, and the interface layer 204 interposed therebetween after heat treatment. That is, FIG. 6 is a graph illustrating the concentrations of the dopant and oxygen measured after heat treatment is performed.

Referring to both FIGS. 4 and 6, it can be appreciated that the concentration of oxygen is very similar before and after heat treatment is performed. Accordingly, the interface layer 204 having a relatively high concentration of oxygen is maintained in a third section S3, between a second section S2 in which the first layer 201 is located and a fourth section S4 in which the second layer 202 is located.

In addition, it can be appreciated that the first layer 201, which is formed as the first conductive dopant diffuses to the undoped semiconductor layer 201a after heat treatment, has a doping concentration the same as or similar to that in the second layer 202, which corresponds to the doped semiconductor layer 202a after heat treatment. Thereby, it can be appreciated that the entire first conductive area 20 has a consistent doping concentration after heat treatment.

In the present embodiment, both the first and second conductive areas 20 and 30 are subjected to heat treatment in a single process, which simplifies a heat treatment process. However, the embodiment of the present inventive concept is not limited thereto, and the first and second conductive areas 20 and 30 may be subjected to heat treatment in different processes. In addition, the heat treatment process of forming at least one of the first and second conductive areas 20 and 30 may be not required, and at least one of the first and second conductive areas 20 and 30 may be formed via any high-temperature process during the manufacture of the solar cell 100.

The present embodiment illustrates that the second conductive area 30 is formed by forming the doping layer 300 and then performing heat treatment on the doping layer 300. However, the embodiment of the present inventive concept is not limited thereto, and the second conductive area 30 may be formed via any of various known methods. In one example, various methods, such as ion implantation, thermal diffusion using heat treatment in the state in which gas including dopant is used, and laser doping, may be applied.

Figure 3G:
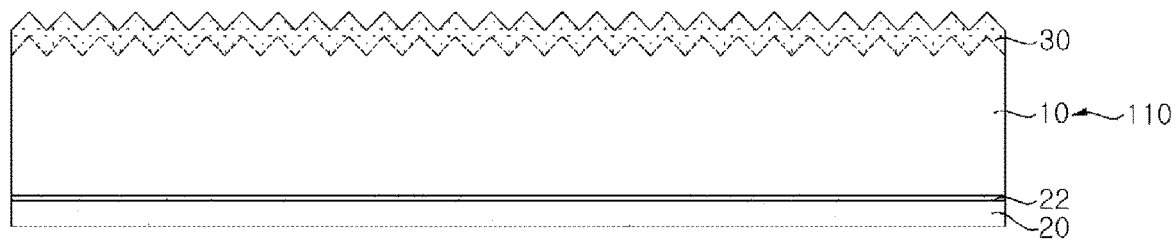

Subsequently, as illustrated in FIG. 3G, the doping layer 300 may be removed. In one example, the doping layer 300 may be easily removed using an etching solution (e.g. diluted hydrofluoric acid (DHF)).

Figure 3H:
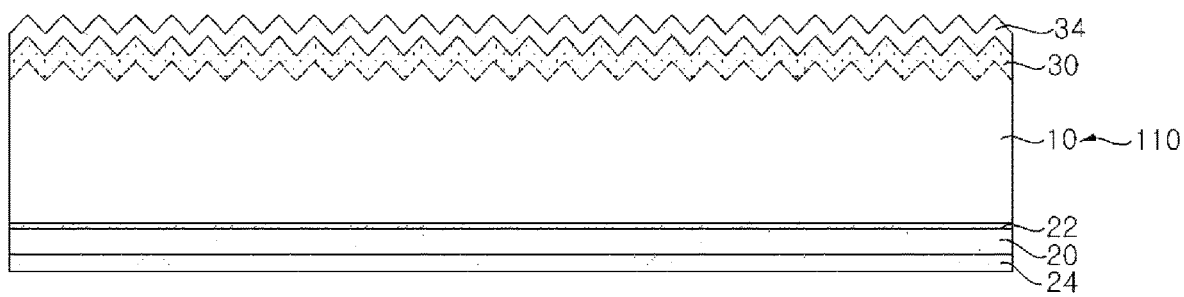

Subsequently, as illustrated in FIG. 3H, insulation films are formed on the front surface and the back surface of the semiconductor substrate 110. That is, the first passivation film 24 is formed on the back surface of the semiconductor substrate 110, and the second passivation film 34 is formed on the front surface of the semiconductor substrate 110.

More specifically, the first passivation film 24 is formed throughout the back surface of the semiconductor substrate 110, and the second passivation film 34 is formed throughout the front surface of the semiconductor substrate 110. The first passivation film 24 and the second passivation film 34 may be formed via any of various methods, such as vacuum deposition, chemical vapor deposition, spin coating, screen printing, or spray coating. The sequence of forming the first passivation film 24 and the second passivation film 34 is not limited.

Figure 3I:
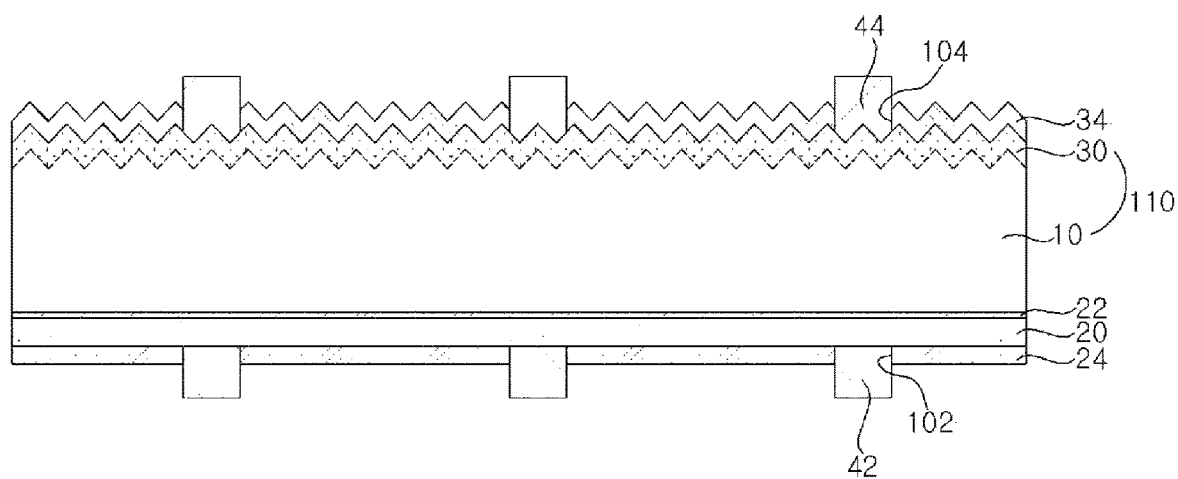

Subsequently, as illustrated in FIG. 3I, the first and second electrodes 42 and 44, which are connected respectively to the first and second conductive areas 20 and 30, are formed.

In one example, the first and second openings 102 and 104 are formed in the first and second passivation films 24 and 34 via patterning, and thereafter are filled with the first and second electrodes 42 and 44. At this time, the first and second openings 102 and 104 may be formed via any of various methods, such as laser ablation using a laser, or etching using an etching solution or etching paste. In addition, the first and second electrodes 42 and 44 may be formed via any of various methods, such as plating or deposition.

In another example, after a paste for the formation of the first and second electrodes 42 and 44 may be applied on the first and second passivation films 24 and 34 via screen printing or the like, for example, fire-through phenomenon or laser firing contact may be used in order to form the first and second electrodes 42 and 44 having the above-described shape. In this case, because the first and second openings 102 and 104 are formed when the first and second electrodes 42 and 44 are formed, no process of forming the first and second openings 102 and 104 is added.

In the present embodiment, after the semiconductor layers 20a including the undoped semiconductor layer 201a, which is formed at a relatively high rate, and the doped semiconductor layer 202a, which includes the first conductive dopant, are formed, the first conductive area 20 is formed by diffusing the first conductive dopant included in the doped semiconductor layer 202a to the undoped semiconductor layer 201a via heat treatment. Thereby, the first conductive area 20 may be formed within a reduced time while maintaining excellent properties, which may increase the productivity of the solar cell 100.

On the other hand, unlike the present embodiment, when a single undoped semiconductor layer 201a is formed in order to form the first conductive area 20, it is necessary to perform a separate doping process later. Such a requirement for an additional process may increase the number of processes, thus causing deterioration in the productivity of the solar cell 100. In addition, when a single doped semiconductor layer 202a is formed in order to form the first conductive area 20, the process time necessary in order to form the doped semiconductor layer 202a to a sufficient thickness may be increased due to the low deposition rate. This may deteriorate the productivity of the solar cell 100.

Hereinafter, solar cells in accordance with other embodiments of the present inventive concept will be described in detail with reference to FIGS. 7 to 9. A detailed description related to parts that are the same or extremely similar to those of the above description will be omitted below and the following description will be focused on different parts. In addition, combinations of the above-described embodiments or alternative embodiments thereof with the following embodiment or alternative embodiments thereof fall within the scope of the embodiment of the present inventive concept.

Figure 7:
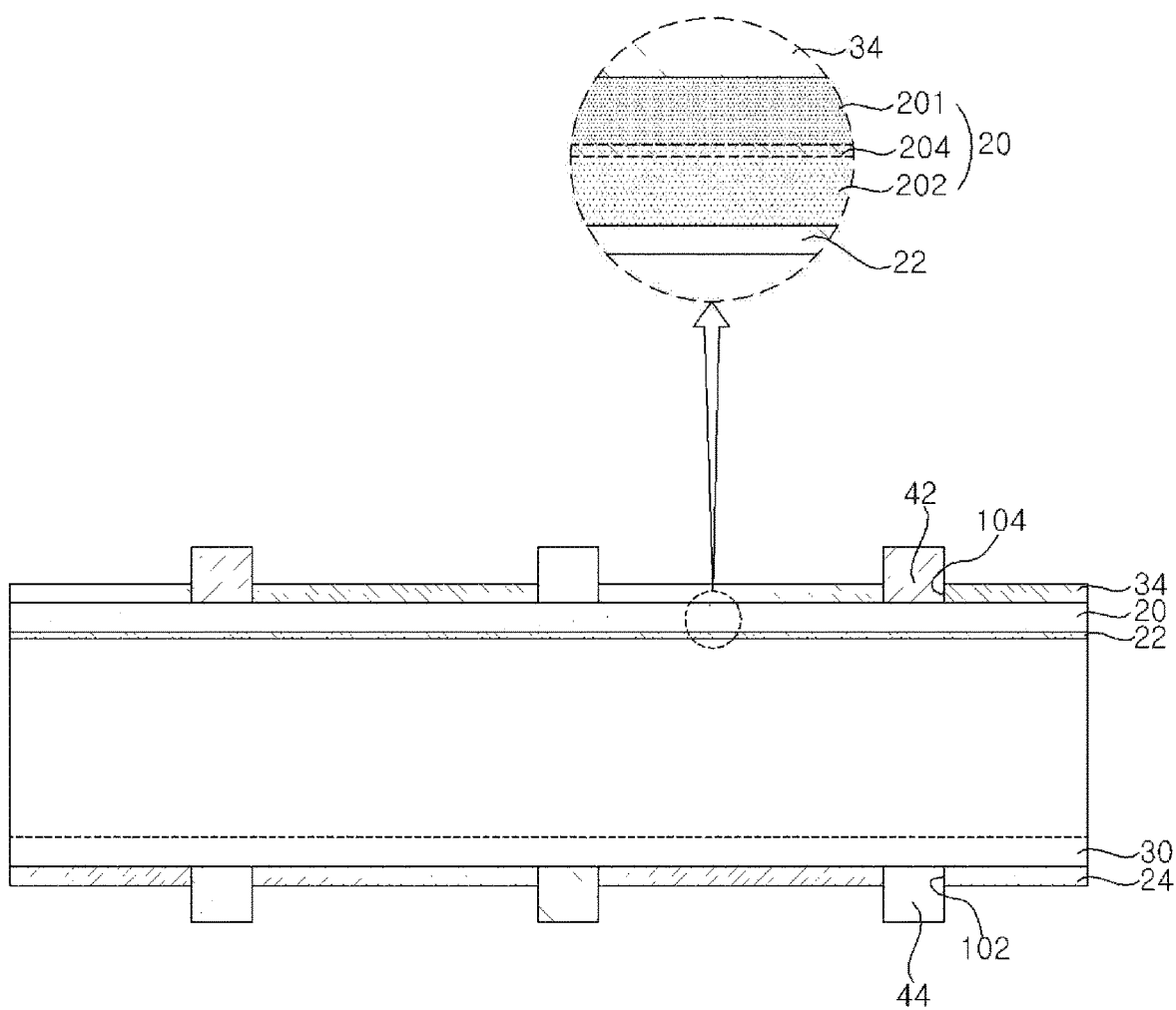
FIG. 7 is a sectional view illustrating a solar cell in accordance with another embodiment of the present inventive concept.

FIG. 7 is a sectional view illustrating a solar cell in accordance with another embodiment of the present inventive concept.

Referring to FIG. 7, in the present embodiment, the tunneling layer 22, the first conductive area 20, and the first electrode 42 connected to the first conductive area 20 are disposed on the front surface of the semiconductor substrate 110, and the second conductive area 30 and the second electrode 44 connected to the second conductive area 30 are disposed on the back surface of the semiconductor substrate 110. At this time, the first conductive area 20 may include the first layer 201 and the second layer 202 disposed with the interface layer 204 interposed therebetween, and the second conductive area 30 may be a doped area. Although FIG. 7 illustrates that both the front surface and the back surface of the semiconductor substrate 110 have no protrusions formed via texturing, the embodiment of the present inventive concept is not limited thereto. Thus, at least one of the front surface and the back surface of the semiconductor substrate 110 may have protrusions formed via texturing.

Figure 8:
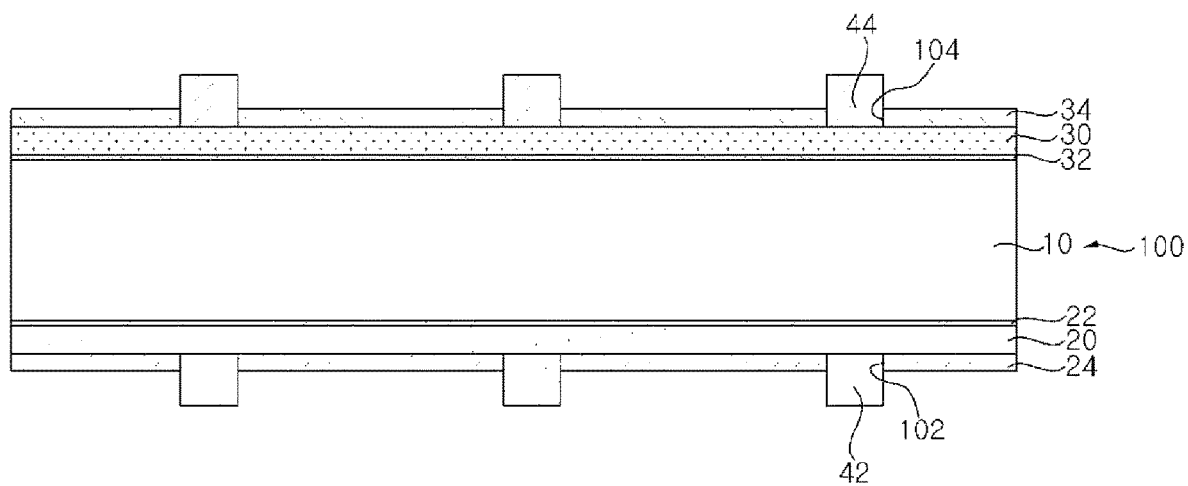
FIG. 8 is a sectional view illustrating a solar cell in accordance with another embodiment of the present inventive concept.

FIG. 8 is a sectional view illustrating a solar cell in accordance with another embodiment of the present inventive concept.

Referring to FIG. 8, each of the first and second conductive areas 20 and 30 may have a crystalline structure different from that of the semiconductor substrate 110. When the second conductive area 30 has a crystalline structure different from that of the semiconductor substrate 110, another tunneling layer 32 may be provided between the second conductive area 30 and the semiconductor substrate 110. In this case, a detailed description of the second conductive area 30 and the other tunneling layer 32 will be omitted because the above description related to the first conductive area 20 and the tunneling layer 22 may be applied to the second conductive area 30 and the other tunneling layer 32.

In the present embodiment, the other tunneling layer 32 is provided between the semiconductor substrate 110 and the second conductive area 30, which may maximize passivation effects and ensure the smooth movement of carriers.

In addition, the semiconductor substrate 110 includes only the base area 10 without a separate doped area. In one example, the difference between the highest doping concentration and the lowest doping concentration in the semiconductor substrate 110 may be 30% or less. At this time, the value of 30% or less is given by way of example in order to define the degree at which a doped area is not formed, and the embodiment of the present inventive concept is not limited thereto. Thus, the embodiment of the present inventive concept typically includes all cases in which the semiconductor substrate 110 includes no doped area.

In the present embodiment, the open-circuit voltage may be increased because the semiconductor substrate 110 includes no doped area. This is because providing the semiconductor substrate 110 with a doped area may prevent surface recombination.

FIG. 8 illustrates an alteration or modification based on the solar cell 100 illustrated in FIG. 1. However, the embodiment of the present inventive concept is not limited thereto, and any alteration or modification based on the solar cell 100 illustrated in FIG. 7 falls within the scope of the embodiment of the present inventive concept. In addition, although an example in which both the front surface and the back surface of the semiconductor substrate 110 have no protrusions formed via texturing is illustrated, the embodiment of the present inventive concept is not limited thereto. Thus, at least one of the front surface and the back surface of the semiconductor substrate 110 may have protrusions formed via texturing.

Figure 9:
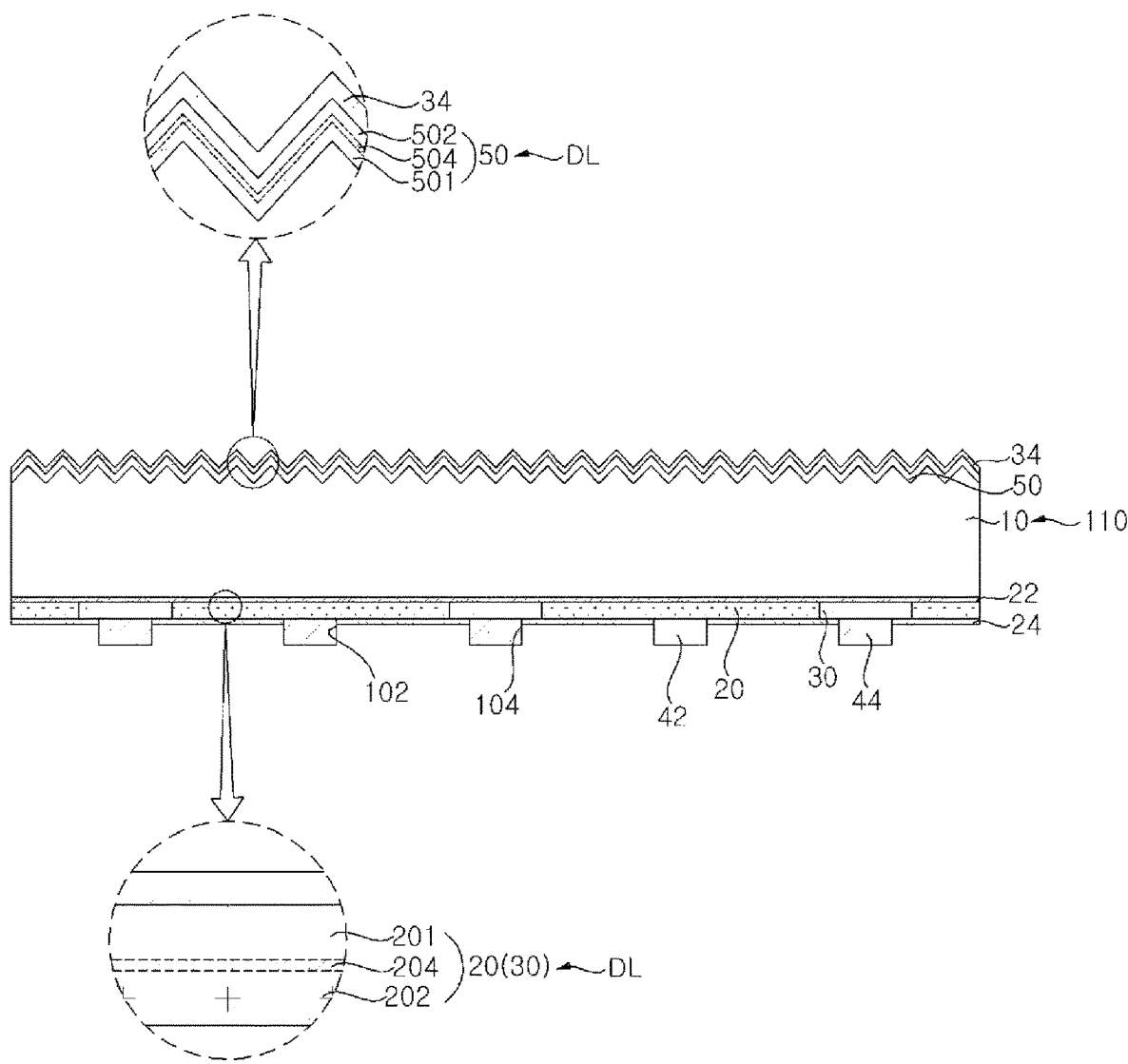
FIG. 9 is a sectional view illustrating a solar cell in accordance with a further embodiment of the present inventive concept.

FIG. 9 is a sectional view illustrating a solar cell in accordance with a further embodiment of the present inventive concept.

Referring to FIG. 9, the solar cell 100 in accordance with the present embodiment may be of a back contact type. That is, the tunneling layer 22 may be disposed on the back surface of the semiconductor substrate 110, and the first and second conductive areas 20 and 30 may be disposed on the same plane over the tunneling layer 22. Because the first and second conductive areas 20 and 30 are formed over the semiconductor substrate 110 separately from the semiconductor substrate 110, the first and second conductive areas 20 and 30 may have a crystalline structure different from that of the semiconductor substrate 110 in order to be easily formed over the semiconductor layer 110.

For example, the first conductive area 20 may be formed by doping amorphous semiconductors, microcrystalline semiconductors, or polycrystalline semiconductors (e.g. amorphous silicon, microcrystalline silicon, or polycrystalline silicon), which may be easily manufactured via various methods, such as deposition, with a first conductive dopant. In particular, the first conductive area 20 may comprise polycrystalline semiconductors (e.g. polycrystalline silicon). Similarly, the second conductive area 30 may be formed by doping amorphous semiconductors, microcrystalline semiconductors, or polycrystalline semiconductors (e.g. amorphous silicon, microcrystalline silicon, or polycrystalline silicon), which may be easily manufactured via various methods, such as deposition, with a second conductive dopant. In particular, the second conductive area 30 may comprise polycrystalline semiconductors (e.g. polycrystalline silicon).

In addition, the field area 50 may be formed over the front surface of the semiconductor substrate 110 so as to come into contact with the semiconductor substrate 110. The field area 50 may have the same conductive type as that of the semiconductor substrate 110, and may have a higher doping concentration than that in the semiconductor substrate 110.

In the present embodiment, because the field area 50 is formed over the semiconductor substrate 110 separately from the semiconductor substrate 110, the field area 50 may have a crystalline structure different from that of the semiconductor substrate 110 in order to be easily formed over the semiconductor substrate 110. For example, the field area 50 may be formed by doping amorphous semiconductors, microcrystalline semiconductors, or polycrystalline semiconductors (e.g. amorphous silicon, microcrystalline silicon, or polycrystalline silicon), which may be easily manufactured via various methods, such as deposition, with a first or second conductive dopant. In particular, the field area 50 may comprise polycrystalline semiconductors (e.g. polycrystalline silicon).

At this time, the field area 50, which is disposed on the front surface of the semiconductor substrate 110 and is not connected to the electrodes 42 and 44, may be a dopant layer DL. In addition, at least one of the first and second conductive areas 20 and 30 disposed over the back surface of the semiconductor substrate 110 may be a dopant layer DL.

That is, the field area 50 may include a first layer 501, a second layer 502, and an interface layer 504 interposed therebetween. The first layer 501 may be formed in contact with the semiconductor substrate 110. A detailed description related to other details of the first layer 501, the second layer 502, and the interface layer 504 will be omitted because the above description related to the first layer 201, the second layer 202 and the interface layer 204 may be applied to the first layer 501, the second layer 502, and the interface layer 504.

In addition, the first and second conductive areas 20 and 30 may include the first layer 201, the second layer 202, and the interface layer 204 interposed therebetween. A detailed description related to the first layer 201, the second layer 202, and the interface layer 204 will be omitted because the above description related to the first layer 201, the second layer 202 and the interface layer 204 may be applied thereto. In this case, the first and second conductive areas 20 and 30 may be formed by forming a plurality of semiconductor layers 20a (FIG. 3C), which include at least an undoped semiconductor layer 201a (FIG. 3C), a first or second conductive-type doped semiconductor layer 202a (FIG. 3C) and an interface layer 204, over the tunneling layer 22, and thereafter performing over-doping on a portion of the semiconductor layers 20a using a dopant having an opposite, that is, second or first, conductive type and then performing heat treatment. For example, when attempting to form the first conductive area 20 over a relatively wide area, the semiconductor layers 20a of a first conductive type may be formed, and thereafter a portion thereof corresponding to the second conductive area 30 may be subjected to over-doping using a second conductive dopant. Thereby, because over-doping is performed on a relatively small area, the first and second conductive areas 20 and 30 may be formed in a simplified manufacturing process while maintaining excellent properties thereof.

The present embodiment illustrates that each of the field area 50 and the first and second conductive areas 20 and 30 includes the first layer 501 or 201, the second layer 502 or 202, and the interface layer 504 or 204. However, the embodiment of the present inventive concept is not limited thereto, and any one of the field area 50 and the first and second conductive areas 20 and 30 may have the above-described configuration.

As is apparent from the above description, in accordance with the embodiments of the present inventive concept, after a plurality of semiconductor layers including an undoped semiconductor layer, which is formed at a relatively high rate, and a doped semiconductor layer including a dopant are formed, a conductive area is formed by diffusing the dopant included in the doped semiconductor layer to the undoped semiconductor layer via heat treatment. Thereby, the conductive area may be manufactured within a reduced processing time while maintaining excellent properties, which may improve the productivity of a solar cell.

The above described features, configurations, effects, and the like are included in at least one of the embodiments of the present inventive concept, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as including in the scope and spirit of the inventive concept as disclosed in the accompanying claims.

What is claimed is:
1. A solar cell comprising:
a single crystalline semiconductor substrate;
an oxide layer disposed on a first surface of the single crystalline semiconductor substrate;
a conductive area disposed on the oxide layer and including
a first polycrystalline silicon layer, a second polycrystalline silicon layer and an interface layer interposed between the first polycrystalline silicon layer and the second polycrystalline silicon layer;
a diffusion region on a second surface of the single crystalline semiconductor substrate, and constituting a portion of the single crystalline silicon substrate;
a first passivation on the conductive area and having a plurality of first openings;
a second passivation on the diffusion region and having a plurality of second openings;
a plurality of first electrodes each connected to the conductive area through the plurality of first openings; and
a plurality of second electrodes each connected to the diffusion region through the plurality of second openings,
wherein the conductive area has the same conductive type as a conductive type of the single crystalline silicon substrate, and
wherein the diffusion region has a conductive type opposite to the conductive type of the single crystalline silicon substrate.

2. The solar cell according to claim 1,
wherein the interface layer is a silicon oxide layer.

3. The solar cell according to claim 1, wherein the interface layer is an oxide layer having a higher concentration of oxygen than that in each of the first and second polycrystalline silicon layers, and
wherein the concentration of oxygen in the interface layer is at least 1.5 times a concentration of oxygen in each of the first and second polycrystalline silicon layers.

4. The solar cell according to claim 3, wherein the concentration of oxygen in the interface layer is within a range from 2 times to 10 times the concentration of oxygen in each of the first and second polycrystalline silicon layers.

5. The solar cell according to claim 1, wherein the interface layer is thinner than each of the first and second polycrystalline silicon layers.

6. The solar cell according to claim 1,
wherein a thickness of the interface layer is equal to or less than a thickness of the oxide layer.

7. The solar cell according to claim 3,
wherein the concentration of oxygen in the interface layer is less than a concentration of oxygen in the oxide layer.

8. The solar cell according to claim 1, wherein the interface layer has a thickness of 1 nm or less.

9. The solar cell according to claim 1, wherein the interface layer includes a plurality of interface layers provided in the conductive area.

10. The solar cell according to claim 1, wherein the interface layer is in contact with the first and second polycrystalline silicon layers that are adjacent thereto.

11. The solar cell according to claim 1, wherein a dopant included in the conductive area has a higher doping concentration than that in the single crystalline semiconductor substrate.

12. The solar cell according to claim 1, wherein the second surface is a front surface of the single crystalline semiconductor substrate, and
wherein the first surface is a back surface of the single crystalline semiconductor substrate.

13. The solar cell according to claim 1, further comprising a third polycrystalline silicon layer on the second polycrystalline silicon layer, and another interface layer interposed between the second polycrystalline silicon layer and the third polycrystalline silicon layer.

* * * * *